(12) United States Patent
Kwon et al.

(10) Patent No.: US 7,374,972 B2
(45) Date of Patent: May 20, 2008

(54) MICRO-PACKAGE, MULTI-STACK MICRO-PACKAGE, AND MANUFACTURING METHOD THEREFOR

(75) Inventors: Jong-oh Kwon, Suwon-si (KR); Woon-bae Kim, Suwon-si (KR); In-sang Song, Seoul (KR); Ji-hyuk Lim, Suwon-si (KR); Suk-jin Ham, Seoul (KR); Byung-gil Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/782,404

(22) Filed: Jul. 24, 2007

(65) Prior Publication Data

US 2007/0264757 A1      Nov. 15, 2007

Related U.S. Application Data

(62) Division of application No. 11/396,544, filed on Apr. 4, 2006, now Pat. No. 7,285,865.

(30) Foreign Application Priority Data

Apr. 4, 2006   (KR)   ................. 10-2005-0064314

(51) Int. Cl.
  *H01L 21/44* (2006.01)
  *H01L 21/48* (2006.01)
  *H01L 21/50* (2006.01)
(52) U.S. Cl. .................. 438/113; 438/107; 438/110; 438/667; 257/E21
(58) Field of Classification Search ........ 438/106–126, 438/666–669; 257/E21
See application file for complete search history.

(56) References Cited

U.S. PATENT DOCUMENTS

| 6,376,280 | B1 | 4/2002 | Ruby et al. |
| 7,067,354 | B2* | 6/2006 | Prabhu ........................ 438/113 |
| 7,102,238 | B2 | 9/2006 | Noma et al. |
| 7,294,920 | B2* | 11/2007 | Chen et al. ................ 438/106 |
| 2004/0137723 | A1 | 7/2004 | Noma et al. |

* cited by examiner

*Primary Examiner*—Cuong Nguyen
(74) *Attorney, Agent, or Firm*—Sughrue Mion, PLLC

(57) ABSTRACT

A micro package, a multi-stack micro package, and a manufacture method therefor are provided. A micro package according to the present invention includes a device substrate for mounting a devices, being a circuit module; a protection cap for protecting the device; bonding substances which, formed by patterning on predetermined areas on the device substrate, bond the device substrate and the protection cap; layers formed on a portion of the device substrate and a portion of the protection cap and exterior sides of the bonding substances; vias which are formed by etching away another portion of the protection cap, and electrically connected to an upper surface of the device substrate through the bonding substances; under barrier metals (UBMs) formed on the vias; and solder bumpers, being connection terminals for an external signal, formed on the UBMs. As stated above, the present invention has advantages of guaranteeing the hermetical sealing since the above layers prevent moisture absorption from outside at the same time of lowering possibility of damages to the device inside the package since the processing temperature drops below 150° upon wafer bonding due to the use of the polymer substance as a bonding substance.

15 Claims, 14 Drawing Sheets

MICRO-PACKAGE, MULTI-STACK MICRO-PACKAGE, AND MANUFACTURING METHOD THEREFOR

CROSS-REFERENCE TO RELATED APPLICATIONS

This is a divisional of application Ser. No. 11/396,544 filed Apr. 4, 2006 now U.S. Pat. No. 7,285,865. The entire disclosure of the prior application, application Ser. No. 11/396,544 is considered part of the disclosure of the accompanying divisional application and is hereby incorporated by reference.

This application claims priority under 35 U.S.C. § 119 from Korean Patent Application No. 10-2005-0064314, filed on Jul. 15, 2005, the entire contents of which are incorporated herein by reference.

BACKGROUND OF THE INVENTION

1. Field of the Invention

Apparatuses and methods consistent with the present invention relate to a micro package, a multi-stack micro package and a manufacturing method therefor, and more particularly to a micro package, a multi-stack micro package and a manufacturing method therefor capable of guaranteeing hermitical sealing of a package and preventing damages to inside devices of the package.

2. Description of the Related Art

A today's trend in electronics industries is to manufacture light-weighted, compact, high-speed, multi-function, and high-performance products at low cost together with high reliability. The package assembly technologies are one kind of important technologies enabling the design goal of such products to be achieved. The chip scale package or the chip size package is a new type of package recently developed and proposed, which has many advantages compared to typical plastic packages. The most highlighted advantage of the chip scale package is the package size itself. According to the definition by the international semiconductor associations such as the Joint Electron Device Engineering Council (JEDEC) and the Electronic Industry Association of Japan (ETAJ), the chip scale package has a package size smaller than 1.2 times a chip size.

The chip scale package is mainly used for products requiring compactness and mobility, such as digital camcorders, hand-held phones, notebook computers, memory cards, and so on. A semiconductor device such as a digital signal processor (DSP), an application specific integrated circuit (ASIC), a micro controller is built in a chip scale package. Further, the chip scale package is being widely used which mounts therein a memory device such as a dynamic random access memory (DRAM), a flash memory, and so on. Currently, various chip scale packages over 50 types are being developed or have been produced across the world.

FIG. 1 is a cross-sectional view for showing a micro gap wafer-level package disclosed in U.S. Pat. No. 6,376,280. In FIG. 1, the micro gap wafer-level package 10 has a base wafer 12 connected to the micro device 14 being an active device such as an integrated circuit or a passive device such as a sensor. Further, bonding pads 16 and 18, electrically connected to the micro device 14 by conductive leads (not shown), are also associated with the base wafer 12. Around the perimeter of the base wafer 12 is a peripheral pad 20 which may be deposited at the same time as the bonding pads 16 and 18.

A peripheral pad seal, that is, a gasket 22 is extended between a cap wafer 24 and the peripheral pad 20 on the base wafer 12 and is cold weld bonded to the peripheral pad 20 to provide a hermetically sealed volume 25 around the micro device 14. The cap wafer 24 can be made of an electronically non-conductive material or a high-resistivity semiconductor material, such as single crystal silicon. However, the base wafer 12 and the cap wafer 24 are made of the same semiconductor material to avoid thermal expansion mismatch problems.

The cap wafer 24 has through holes 26 and 28 provided therein to allow access to the bonding pads 16 and 18, respectively. Conductors, such as bonding wires 30 and 32 can be respectively wire bonded to the bonding pads 16 and 18 to make the electrical connections to the micro device 14. The gaskets 34 and 36 are bonded to the peripheral pad 20 to form a hermetically sealed volume 25. The hermetically sealed volume 25 encompasses the micro device 14 and the bonding pad gaskets 34 and 36.

However, the micro gap wafer-level package disclosed in the U.S. Pat. No. 6,376,280 has a problem of increasing parasitic capacitance and insertion loss due to wire bonding. Further, there exist problems of limitation on chip size reduction due to formation of the pads and damages to the inside of a package due to a process temperature increased over 350° C. Further, there exist problems of lowering productivity and cost increase due to the wire bonding.

SUMMARY OF THE INVENTION

The present invention has been developed in order to address the above drawbacks and other problems associated with the conventional arrangement. An aspect of the present invention is to provide a micro package, a multi-stack micro package, and a manufacturing method therefor capable of improving hermetical sealing of the package at the same time of preventing damages to devices inside a package by using a low-temperature process upon wafer bonding.

The foregoing and other aspects are substantially realized by providing a micro package, preferably, but not necessarily, comprising at least one device substrate for mounting at least one device; at least one protection cap for protecting the device; at least one bonding substance which, formed by patterning on a first predetermined area on the device substrate, bonds the device substrate and the protection cap; at least one layer formed on a second predetermined area comprising a portion of the device substrate, a portion of the protection cap and at least one exterior side of the bonding substance; at least one via formed in a third predetermined area created by etching away another portion of the protection cap in a predetermined shape, whereby the via is electrically connected to an upper surface of the device substrate through the bonding substance; at least one under-barrier metal (UBM) formed on the via; at least one solder mask formed on a fourth predetermined area on an upper surface of the protection cap; and at least one solder bumper, being a connection terminal for an external signal, formed on the UBM.

The device substrate preferably, but not necessarily comprising a semiconductor wafer comprises; the at least one device, comprising at least one circuit module, mounted on the device substrate; and at least one pad which provides electrical connection to the device.

The protection cap preferably, but not necessarily, comprises at least one of silicon, high-resistivity silicon and glass.

Preferably, but not necessarily, the protection cap further comprises another at least one device comprising a circuit module mounted on a lower surface of the protection cap; and another at least one pad which provides electrical connection to the other device.

The bonding substance preferably, but not necessarily, comprises an anisotropic conductive film (ACF).

Preferably, but not necessarily, the layer protects the device inside the micro package and prevents moisture absorption from outside.

The metal layer preferably, but not necessarily, comprises at least one of Au, Sn, In, Pb, Ag, Bi, Zn, Cu and an alloy of the listed.

Preferably, but not necessarily, the layer and the via are deposited by at least one of electrolytic and electroless plating, sputtering process and electronic beams.

Preferably, but not necessarily, the predetermined shape comprises a shape of 'V.'

Further, the foregoing and other aspects are substantially realized by providing another micro package, comprising at least one device substrate for mounting at least one device; a protection cap for protecting the device; at least one bonding substance which, formed by patterning on a first predetermined area on the device substrate, bonds the device substrate and the protection cap; at least one layer formed on a second predetermined area comprising a portion of the device substrate, a portion of the protection cap and at least one exterior side of the bonding substance; at least one via formed in a third predetermined area created by etching away another portion of the protection cap and a portion of the bonding substance in a predetermined shape, whereby the via is in a direct electrical connection with an upper surface of the device substrate; at least one UBM formed on the via; at least one solder mask formed on a fourth predetermined area on an upper surface of the protection cap; and at least one solder bumper, being a connection terminal for an external signal, formed on the UBM.

Preferably, but not necessarily, the bonding substance comprises at least one of benzocyclobutene (BCB), dry film resist (DFR), epoxy, silicon and urethane.

The foregoing and other aspects are substantially realized by providing a multi-stack micro package preferably, but not necessarily, formed with two or more of the micro package mentioned above vertically stacked.

The foregoing and other aspects are substantially realized by providing a multi-stack micro package preferably, but not necessarily, formed with two or more of the other micro package mentioned above vertically stacked.

The foregoing and other objects and advantages are substantially realized by providing a micro package manufacturing method, preferably, but not necessarily, comprising: (a) bonding at least one device substrate and at least one protection cap by patterning at least one bonding substance on a first predetermined area of the device substrate; (b) etching away a second predetermined area comprising a portion of the device substrate, a portion of the bonding substance and a portion of the protection cap in a predetermined shape to form at least one layer; (c) etching away a third predetermined area comprising another portion of the protection cap in a second predetermined shape to form at least one via, whereby the via is electrically connected to an upper surface of the device substrate through the bonding substance; (d) depositing the layer and the via on the etched second predetermined area and in the etched third predetermined area, respectively; (e) forming at least one UBM on the via; (f) forming at least one solder mask on a fourth predetermined area on an upper surface of the protection cap; (g) forming at least one solder bumper, being a connection terminal for an external signal, on the UBM; and (h) cutting the layer and separating out the micro package.

The device substrate preferably, but not necessarily, comprising a semiconductor wafer, comprises at least one pad which provides electrical connection to the device.

Preferably, but not necessarily, the protection cap comprises at least one of silicon, high-resistivity silicon and glass.

Preferably, but not necessarily, the protection cap further comprises another at least one device comprising a circuit module, mounted on a lower surface of the protection cap; and another at least one pad which provides electrical connection to the other device.

Preferably, but not necessarily, the bonding substance comprises an ACF.

Preferably, but not necessarily, the layer protects the device inside the micro package and prevents moisture absorption from outside.

Preferably, but not necessarily, the layer comprises at least one of Au, Sn, In, Pb, Ag, Bi, Zn, Cu and an alloy of the above listed.

Preferably, but not necessarily, the layer and the via are deposited by at least one of electrolytic and electroless plating, sputtering process and electronic beams.

Preferably, but not necessarily, the predetermined shape comprises a shape of 'V'.

The foregoing and other aspects are substantially realized by providing a multi-stack micro package manufacturing method, preferably, but not necessarily, comprising: (a) bonding at least one device substrate and at least one protection cap by patterning at least one bonding substance on a first predetermined area of the device substrate; (b) etching away a second predetermined area comprising a portion of the device substrate, a portion of the bonding substance and a portion of the protection cap in a first predetermined shape to form at least one layer; (c) etching away a third predetermined area comprising another portion of the protection cap in a second predetermined shape to form at least one via, whereby the via is electrically connected to an upper surface of the device substrate through the bonding substance; (d) depositing the layer and the via on the etched second predetermined area and in the etched third predetermined area, respectively; (e) forming at least one UBM on the via; (f) etching away a fourth predetermined area of the device substrate in a third predetermined shape for formation of at least one connection via and depositing the connection via in the etched fourth predetermined area; (g) forming at least one connection pad on the connection via; (h) stacking vertically two or more of a package manufactured in (a) through (g) by another at least one bonding substance; (i) forming at least one solder mask on a fifth predetermined area of an upper surface of the protection cap of an uppermost stacked package of the two or more of the package; and (j) forming at least one solder bumper, being a connection terminal for an external signal, on the UBM of the uppermost stacked package.

Preferably, but not necessarily, a shape of the fifth predetermined etched areas for the formation of the connection via comprises a shape of '∧.'

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1:
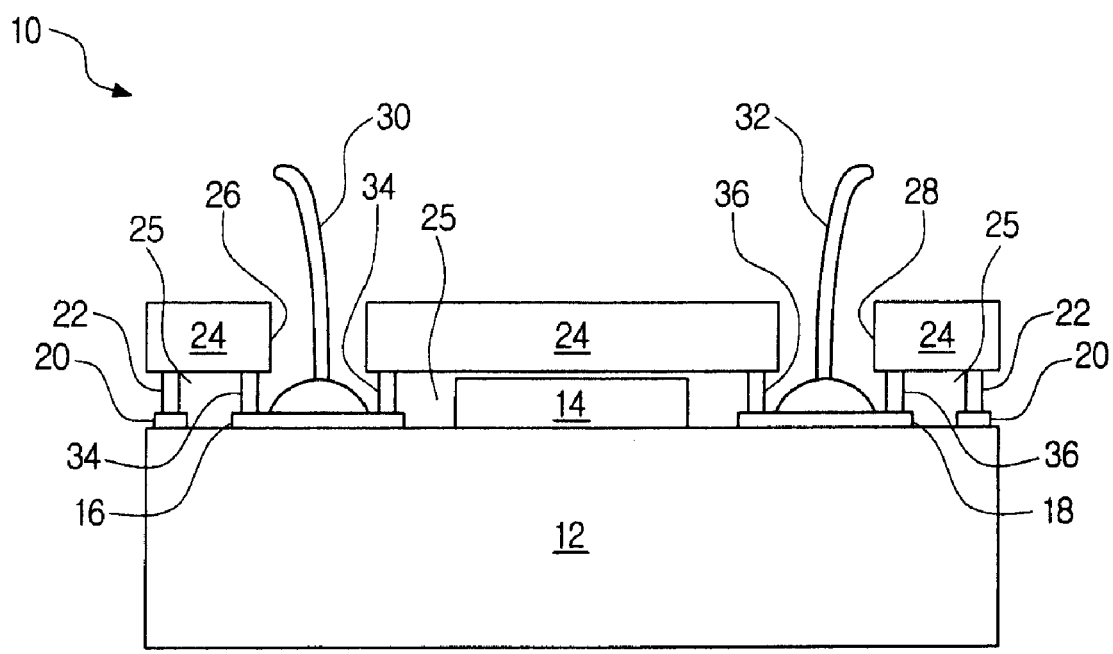
FIG. 1 is a cross-sectional view for showing a chip scale package disclosed in U.S. Pat. No. 6,376,280.

Hereinafter, exemplary embodiments of the present invention will be described with reference to accompanying drawings. Further, like elements are denoted by like reference numerals throughout the disclosure.

As well known, if a semiconductor wafer is manufactured through usual wafer manufacturing processes, individual chips are separated from the wafer and goes through packaging processes. The packaging processes are completely different processes requiring different facilities and raw material from the wafer manufacturing processes. However, exemplary embodiments of the present invention can enable manufacture of a package as a complete product even in a state that the individual chips are not separated from the wafer. Further, exemplary embodiments of the present invention can enable even use of the existing wafer manufacturing facilities and processes for the packaging facilities and processes, which indicates that the additional raw material for packaging can be minimized. Thanks to the above reasons, the packaging method in the present disclosure can realize the manufacturing cost reduction.

FIGS. 2A to 2J are cross-sectional views for showing each manufacturing process for a micro package according to an exemplary embodiment of the present invention.

Figure 2A:
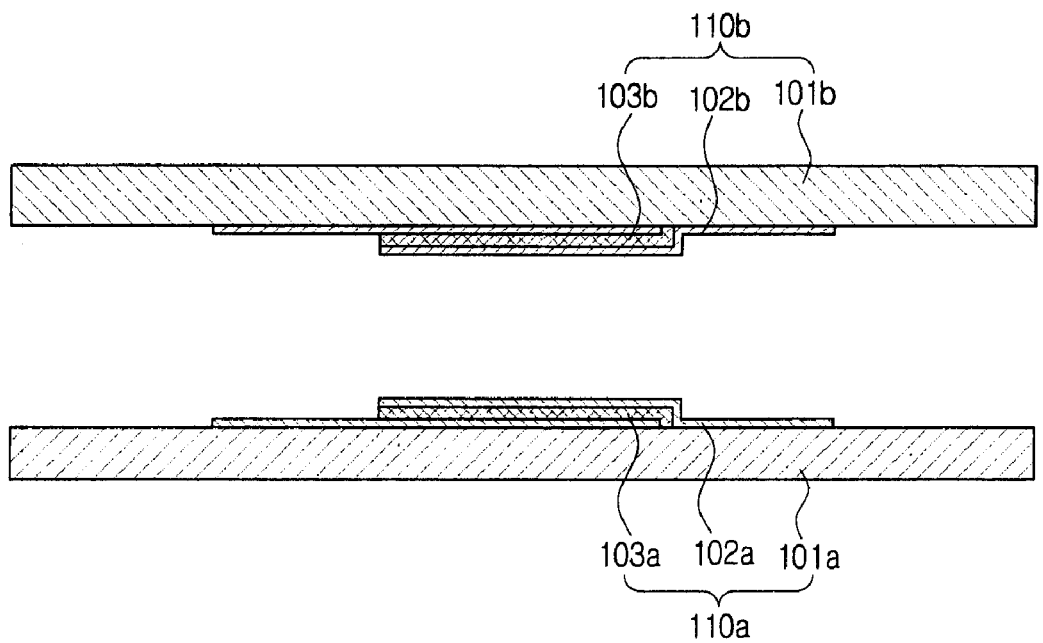
FIGS. 2A to 2J are cross-sectional views for showing each manufacturing process for a micro package according to an exemplary embodiment of the present invention.

First, as shown in FIG. 2A, a device substrate 110a and the protection cap 110b are provided. The device substrate 110a has a first substrate 101a formed of semiconductor wafer, a first device 103a being a circuit module formed on the uppercenter of the first substrate 101a, and a first pad 102a providing electrical connection to the first device 103a.

The protection cap 110b has a second substrate 101b formed of semiconductor wafer, a second device 103b being a circuit module formed on the lower center portion of the second substrate 101b, and a second pad 102b providing electrical connection to the second device 103b. The second substrate 101b is preferably formed of any of silicon, high-resistivity silicon, and glass.

In here, the first and second devices 103a and 103b each being a circuit module can be a circuit provided with a certain function, or can be an RF circuit module having a general filter function. The first device 103a being a circuit module is manufactured over the first substrate 101a, but can be embedded in the first substrate 101a if the first substrate 101a is a printed circuit board (PCB) board.

Figure 2B:
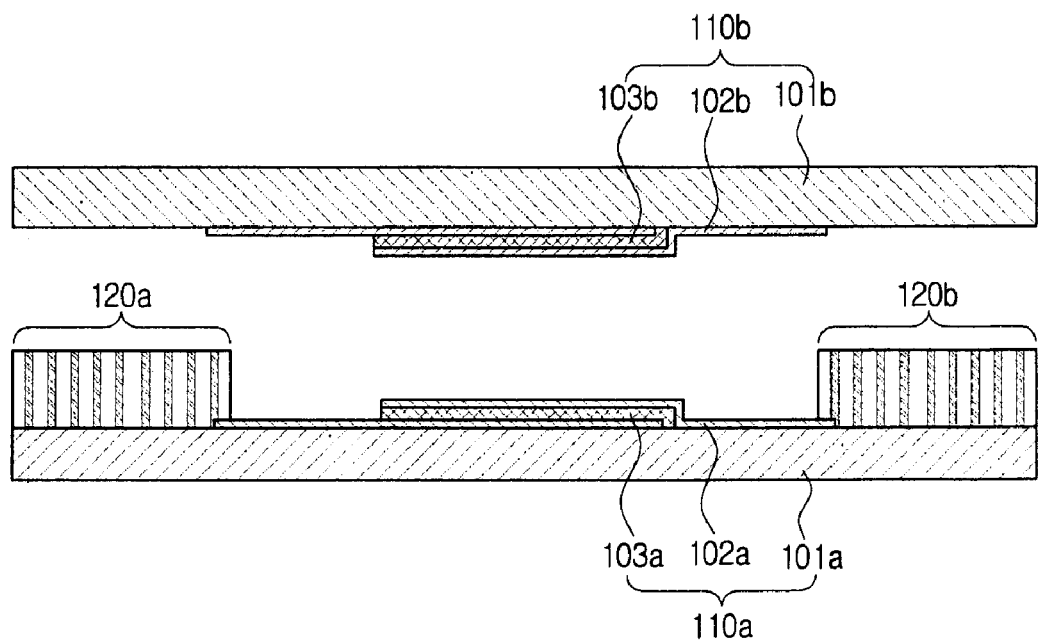

Next, plural bonding substances 120a and 120b are formed by patterning on predetermined upper left and right areas of the first substrate 101a as shown in FIG. 2B. The ACF is used for the bonding substances 120a and 120b. The anisotropic conductive film used for the bonding substance in the present embodiment provides electrical connection between the device substrate 110a and the protection cap 110b.

Figure 2C:
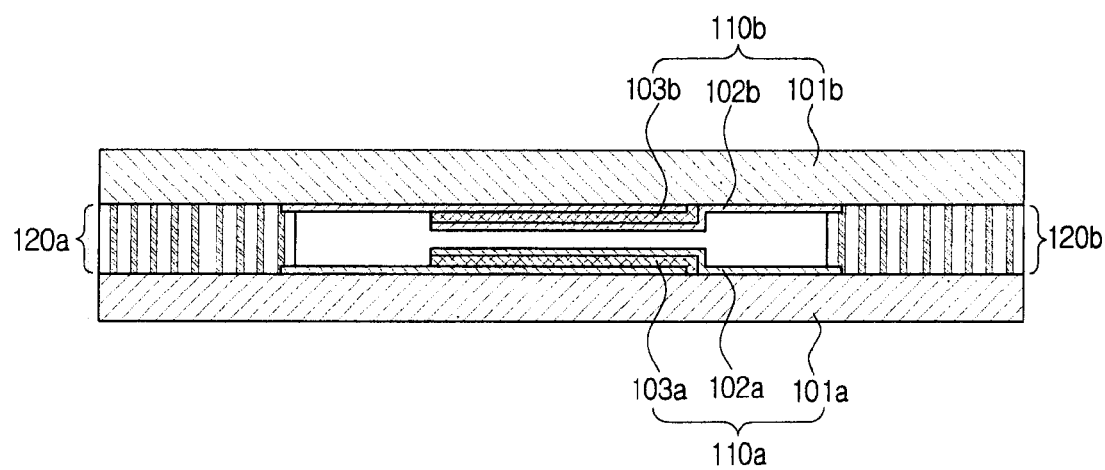

Next, as shown in FIG. 2C, wafer bonding is carried out to bond the device substrate 110a and the protection cap 110b through the plural bonding substances 120a and 120b.

Figure 2D:
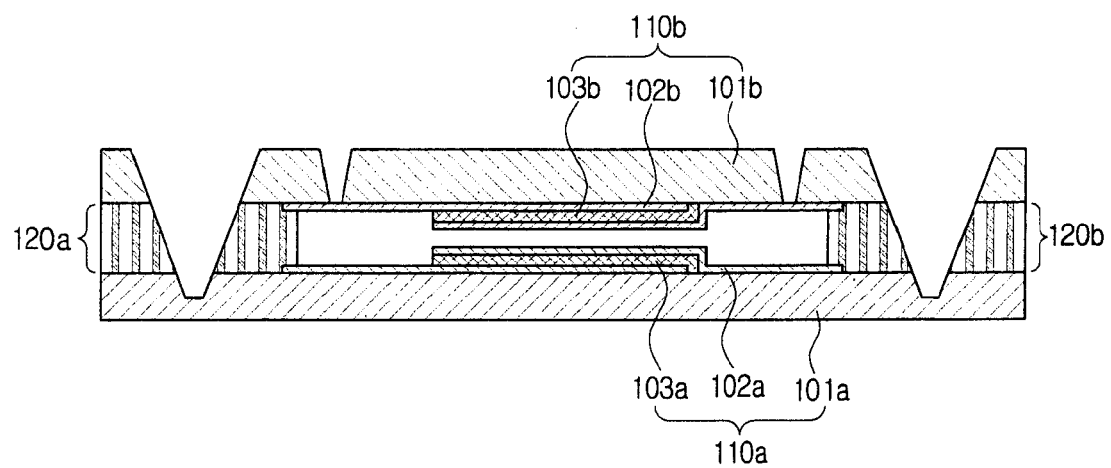

Next, an etching process is carried out to form metal layers and vias as shown in FIG. 2D. That is, the predetermined areas of the bonding substances 120a and 120b and the first and second substrate 101a and 101b above and below the bonding substances 120a and 120b are etched away in a shape of 'V' for formation of metal layers. Further, predetermined areas of the second substrate 101b existing between each of the bonding substances 120a and 120b and the second device 103b is etched away in a shape of 'V' for formation of vias. Such an etching process can be carried out by Si deep etching equipment.

Figure 2E:
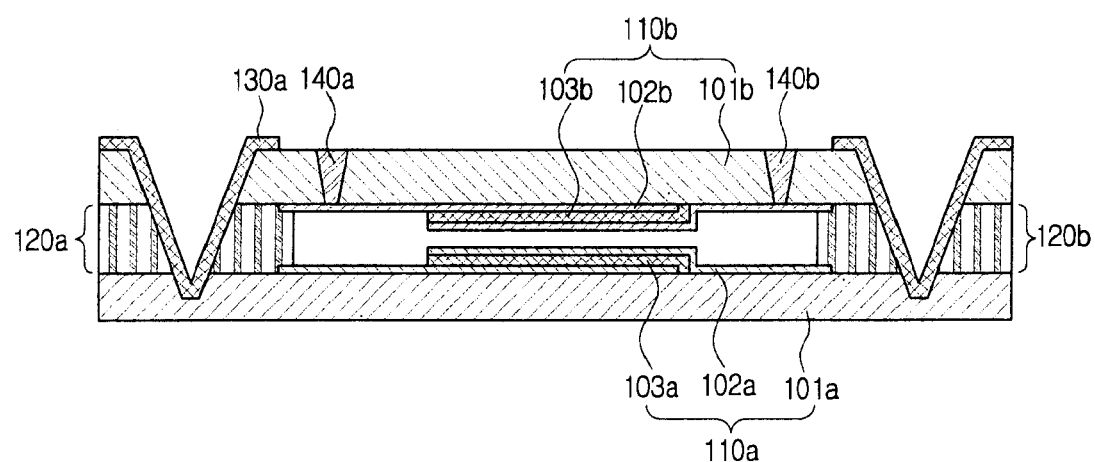

Next, as shown in FIG. 2E, first and second vias 140a and 140b and first and second metal layers 130a and 130b are deposited on the predetermined areas etched away in the etching process. The vias 140a and 140b and the metal layers 130a and 130b can be deposited by electrolytic and electroless plating, sputtering process, electronic beams, and so on.

The metal layers 130a and 130b can be Au, Sn, In, Pb, Ag, Bi, Zn, Cu, or an alloy of the listed. Since the metal layers 130a and 130b protect the package and prevent water or moisture absorption from outside, the metal layers 130a and 130b prevent the first and second device 103a and 103b from being damaged. The vias 140a and 140b interconnect the first and second device 103a and 103b each being a circuit module to external signal connection terminals.

Figure 2F:
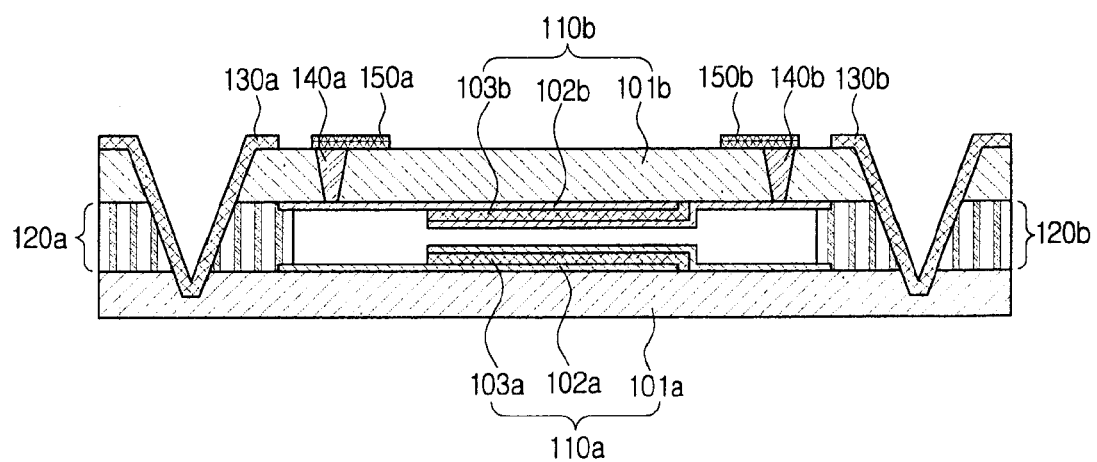

If the steps of depositing the vias 140a and 140b and the metal layers 130a and 130b are finished, first and second UBMs 150a and 150b are formed over predetermined areas over the first and second vias 140a and 140b and the second substrate 101b as shown in FIG. 2F. The first and second UBMs 150a and 150b are each formed spaced apart from the first and second metal layers 130a and 130b, and are generally formed of Ti/Cu, Ti/Ti—Cu/Cu, Cr/Cr—Cu/Cu, TiW/Cu, Al/Ni/Cu, Al/NiV/Cu, or the like.

Figure 2G:
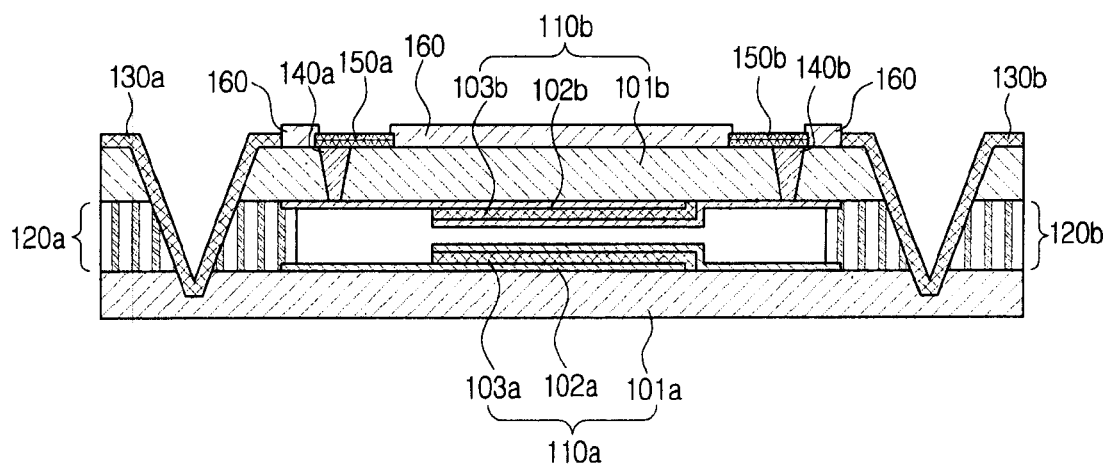

Next, solder masks 160 are formed over the second substrate 101b as shown in FIG. 2G. The solder masks 160 are formed on an area between the first metal layer 130a and the first UBM 150a, an area between the first and second UBMs 150a and 150b, and an area between the second metal layer 130b and the second UBM 150b. The solder masks 160 serve as insulator preventing solder bumpers 170a and 170b, which will be formed over the first and second UBMs 150a and 150b shown in FIG. 2H, from being in contact with other metal components except the first and second UBMs 150a and 150b.

Figure 2H:
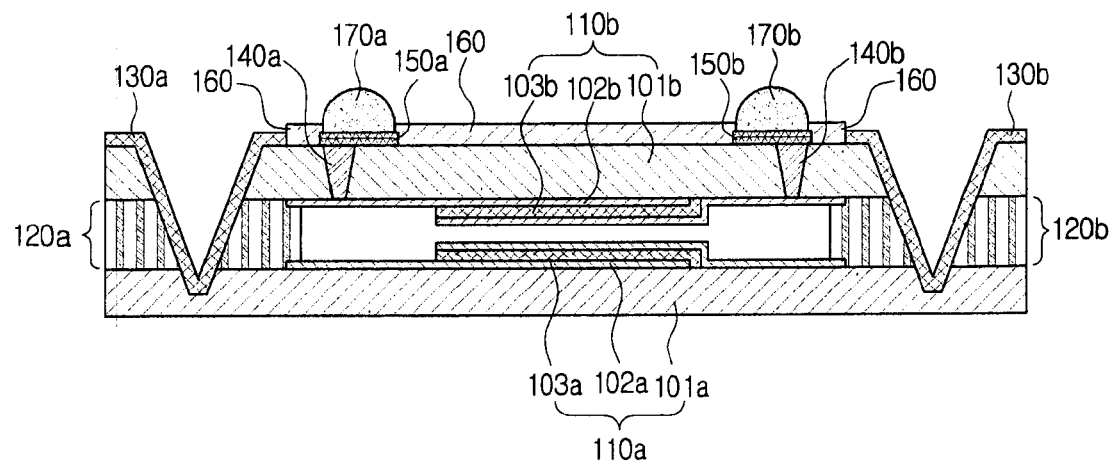

Next, as shown in FIG. 2H, the first and second solder bumpers 170a and 170b are each formed as connection terminals for an external signal over the first and second UBMs 150a and 150b.

The first solder bumper 170a sends an externally applied electric signal to the second device 103b being a circuit module through the first UBM 150a, the first via 140a, and the second pad 102b. Further, the first solder bumper 170a sends an externally applied electric signal to the first device 103a being a circuit module through the first UBM 150a, the first via 140a, and the second pad 102b, the first anisotropic conductive film 120a, and the first pad 102a.

Likewise, the second solder bumper 170b sends an externally applied electric signal to the second device 103b being a circuit module through the second UBM 150b, the second via 140b, and the second pad 102b. Further, the second solder bumper 170b sends an externally applied electric signal to the first device 103a being the circuit module through the second UBM 150*b*, the second via 140*b*, the second pad 102*b*, the second anisotropic conductive film 120*b*, and the first pad 102*a*.

The solder bumpers 170*a* and 170*b* are electrically connected to the first device 103*a* being a circuit module through the UBMs 150*a* and 150*b*, the vias 140*a* and 140*b*, the second pad 102*b*, the anisotropic conductive films 120*a* and 120*b*, and the first pad 102*a*.

Figure 2I:
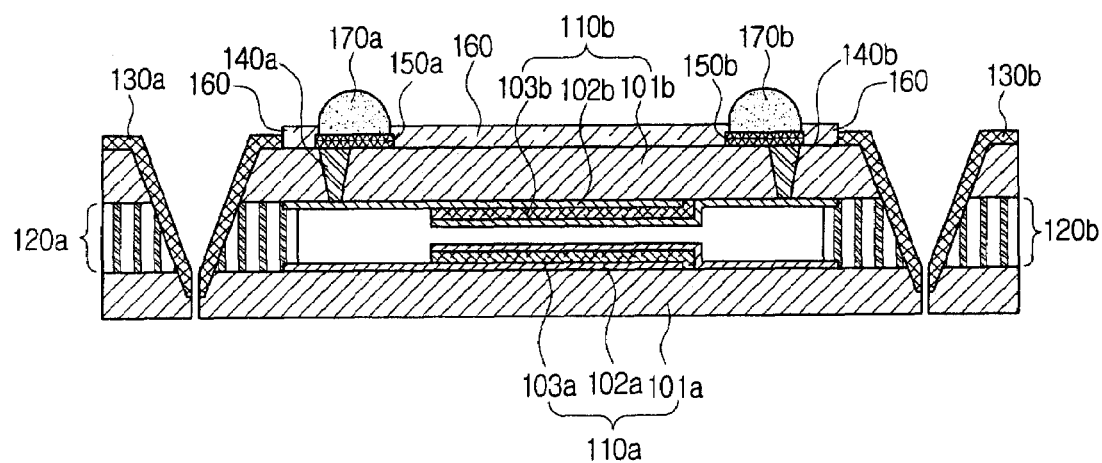

Next, as shown in FIG. 2I, the bottom end portion of each of the metal layers 130*a* and 130*b* formed in a letter 'V' is sawed for a process of separating the wafer into individual semiconductor chips. As a result, a single micro package 1000 shown in FIG. 2J is finally manufactured.

Figure 2J:
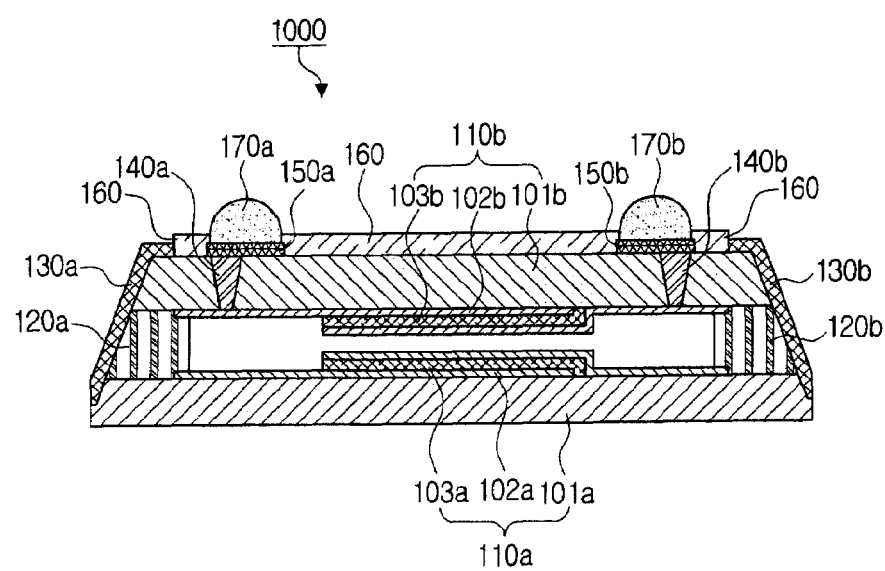
Figure 3:
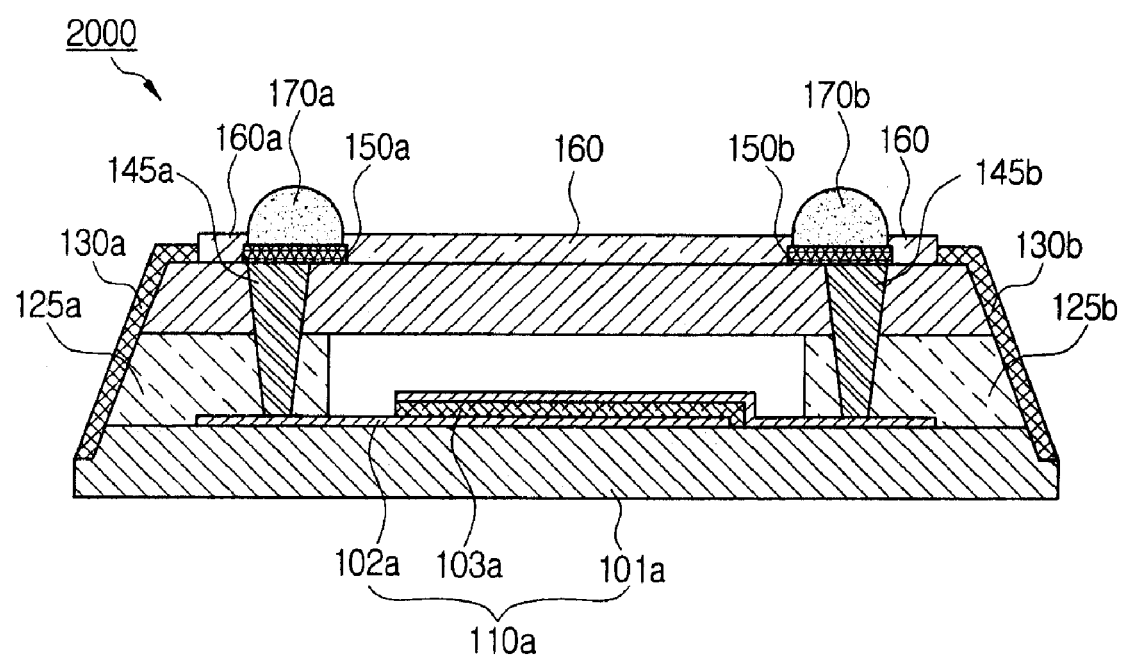
FIG. 3 is a cross-sectional view for showing a micro package according to another exemplary embodiment of the present invention.

FIG. 3 is a cross-sectional view for showing a micro package according to another exemplary embodiment of the present invention. In FIG. 3, general polymer substance can be used as the bonding substance 125*a* and 125*b* instead of the anisotropic conductive film (ACF), unlike FIG. 2J. The polymer substance used for the bonding substance 125*a* and 125*b* can be BCB, DFR, epoxy, silicon, urethane, or the like.

In here, since the polymer substance does not allow electric current to flow in unlike the anisotropic conductive film 120*a* and 120*b*, third and fourth vias 145*a* and 145*b* are formed by the polymer substance as shown in FIG. 3, unlike the structures of the first and second vias 140*a* and 140*b* shown in FIG. 2J. In FIG. 3, the third and fourth vias 145*a* and 145*b* penetrating the polymer substance electrically connect a device 103*a* to the solder bumpers 170*a* and 170*b* being connection terminals for an external circuit.

As above, the use of the polymer substance instead of the anisotropic conductive film has an advantage of reduction of the package-manufacturing cost since the polymer substance is cheaper than the anisotropic conductive film. However, the use of polymer substance has a disadvantage of a more complicated manufacturing process than the use of the anisotropic conductive film. Further, if the anisotropic conductive film or the polymer substance is used as the bonding substance, the possibility of damages to the devices inside a package is lowered since a processing temperature can be much lowered upon wafer bonding than when metal is used as the bonding substance.

Meanwhile, unlike FIG. 2J, FIG. 3 does not show the second pad 102*b* and the second device 103*b*, but the second pad 102*b* and the second device 103*b* can be formed in the same manner as in FIG. 2J.

Figure 4A:
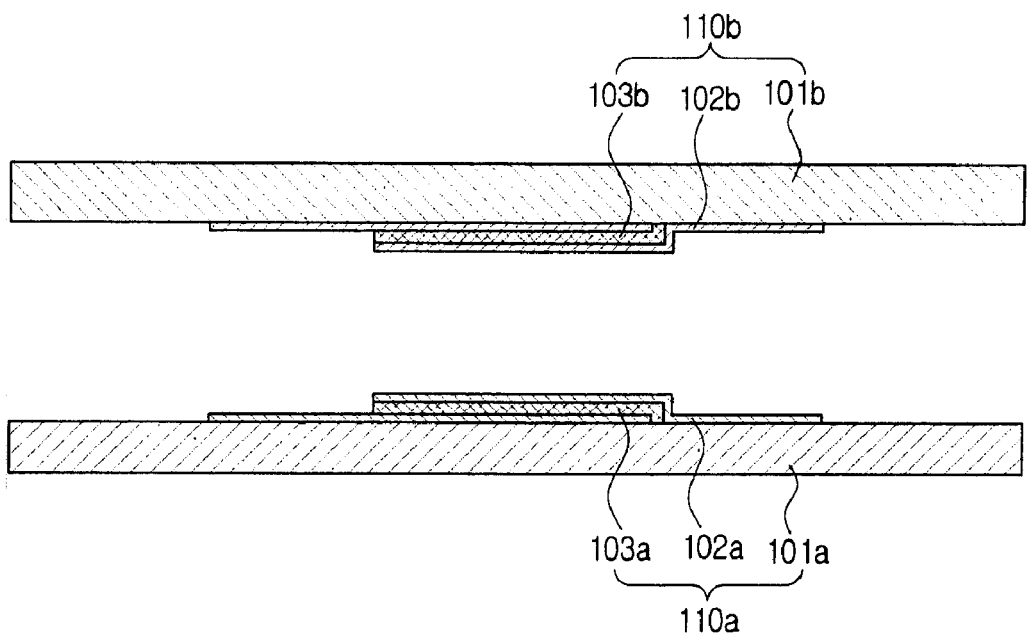
FIGS. 4A to 4N are cross-sectional views for showing each manufacturing process for a multi-stack micro package according to another exemplary embodiment of the present invention.
Figure 4B:
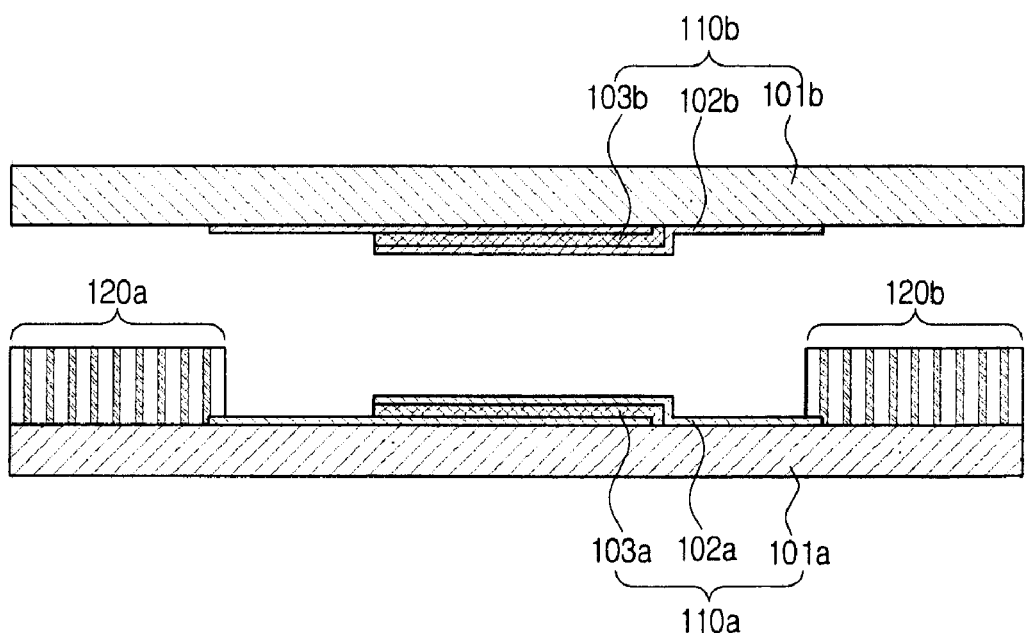
Figure 4C:
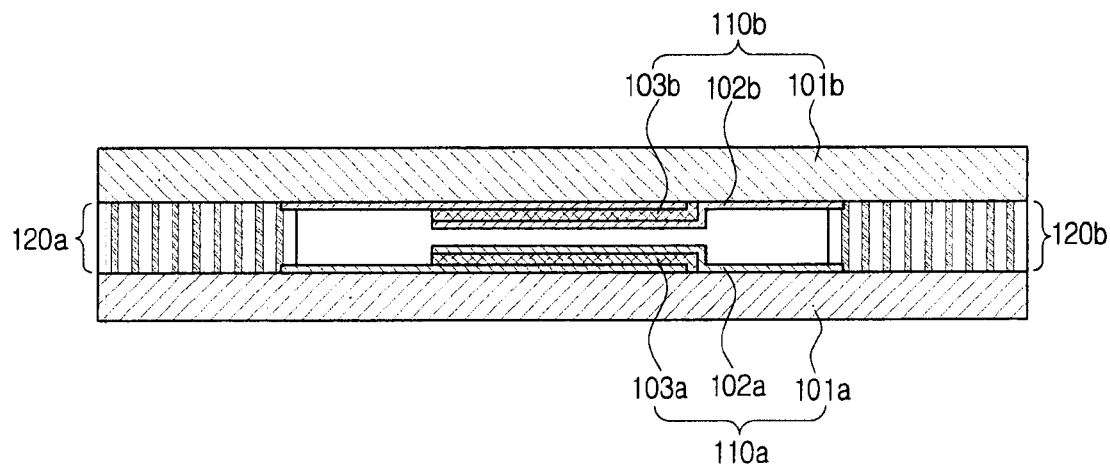
Figure 4D:
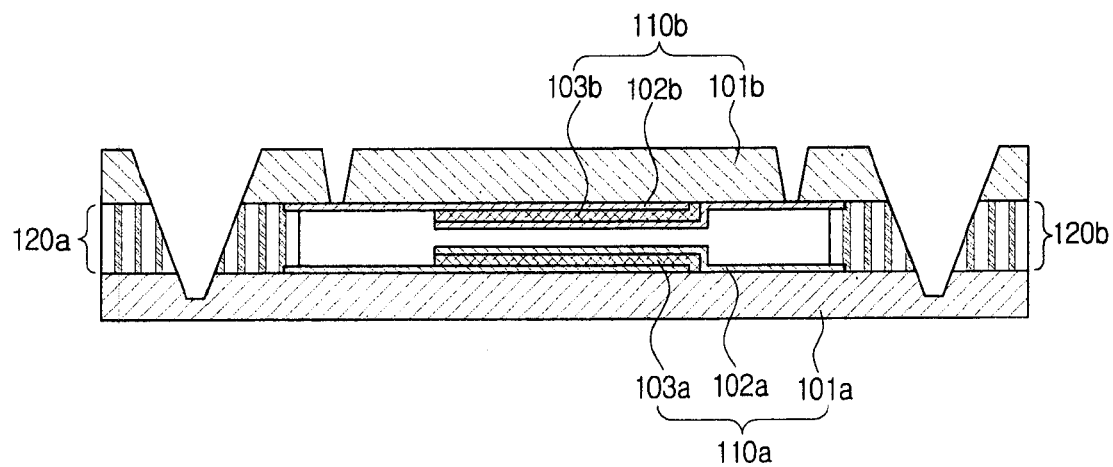
Figure 4E:
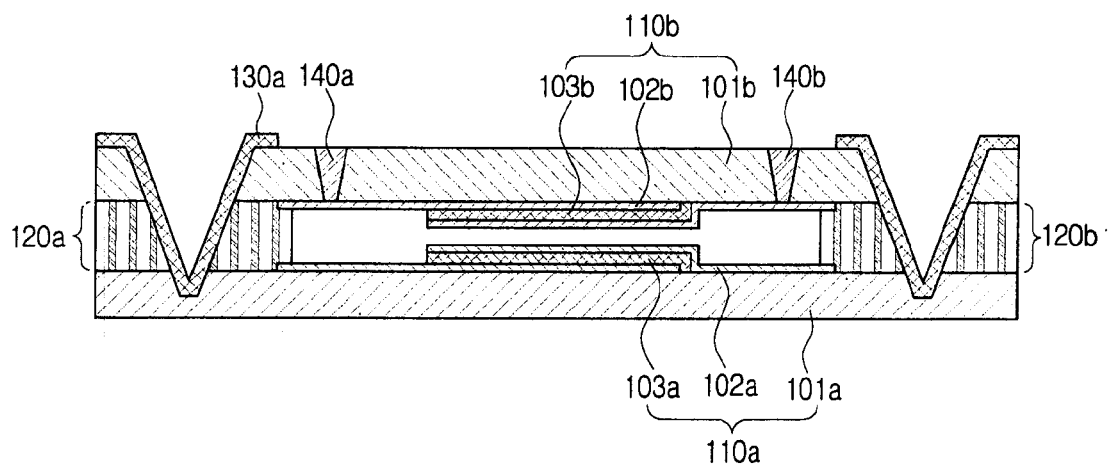
Figure 4F:
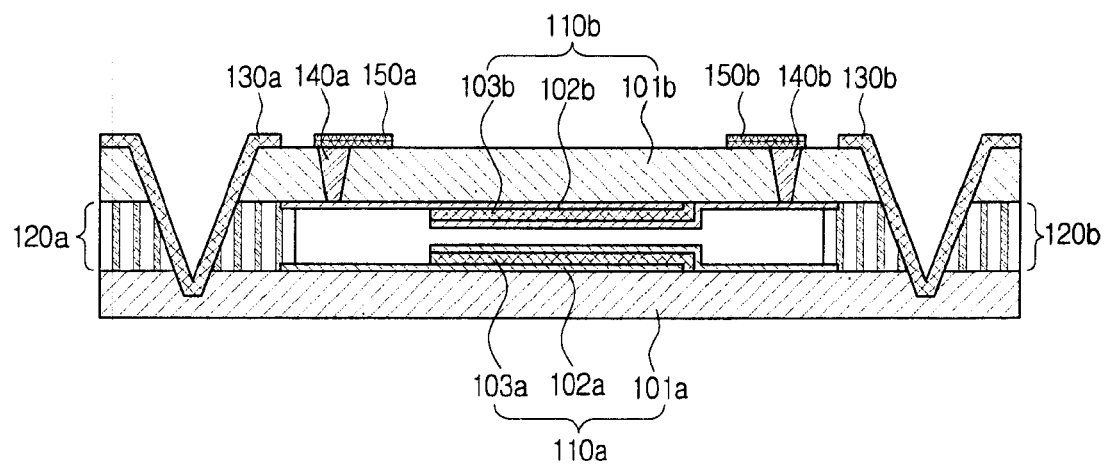
Figure 4G:
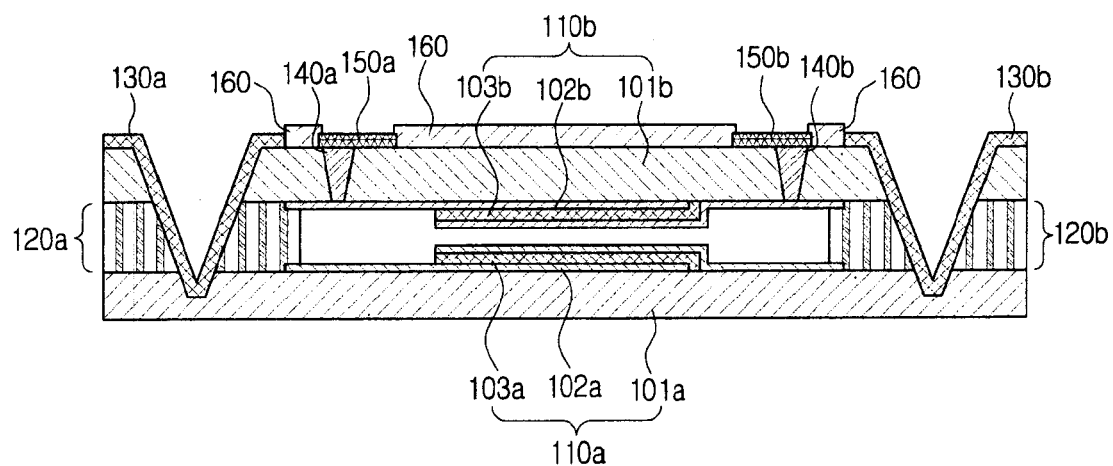
Figure 4H:
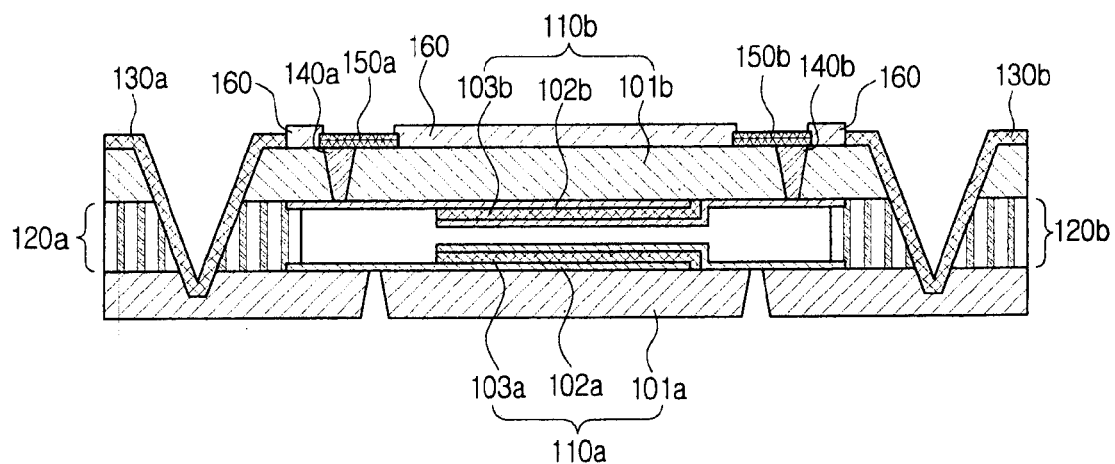
Figure 4I:
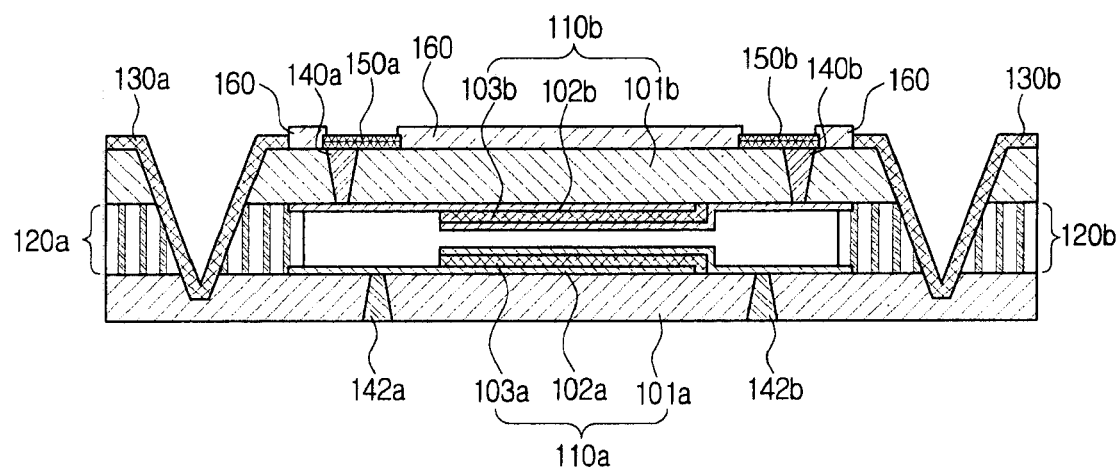
Figure 4J:
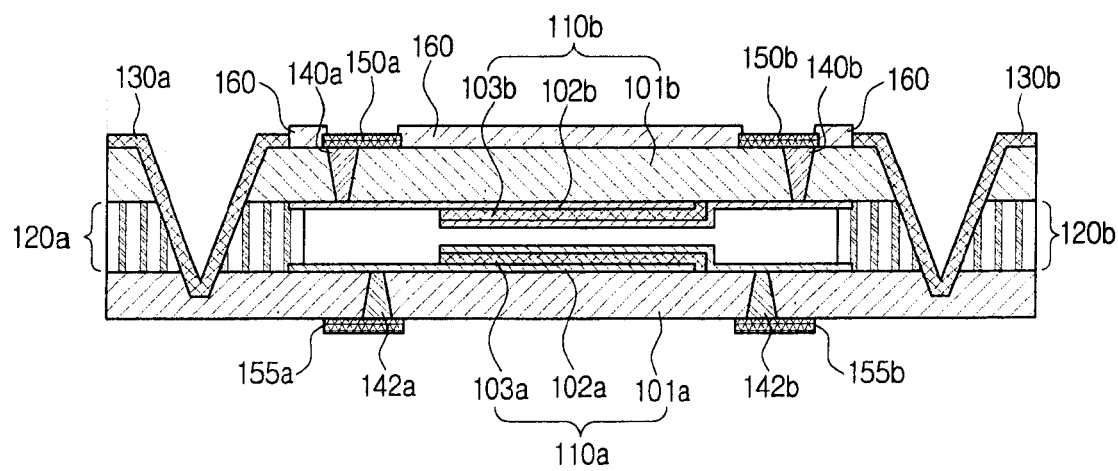
Figure 4K:
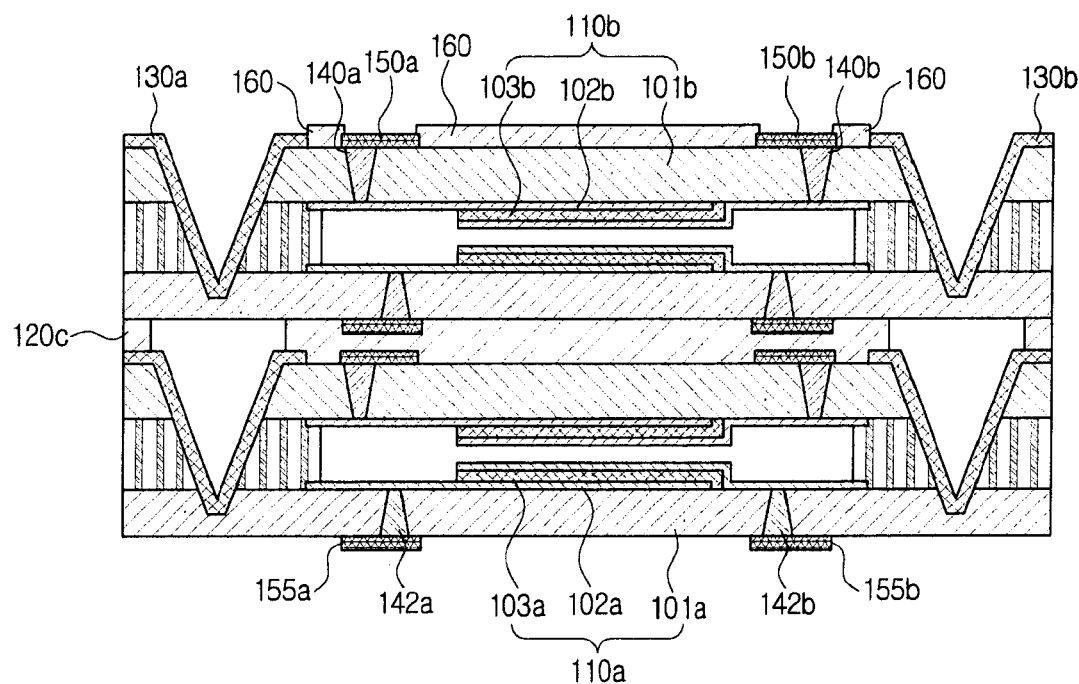
Figure 4L:
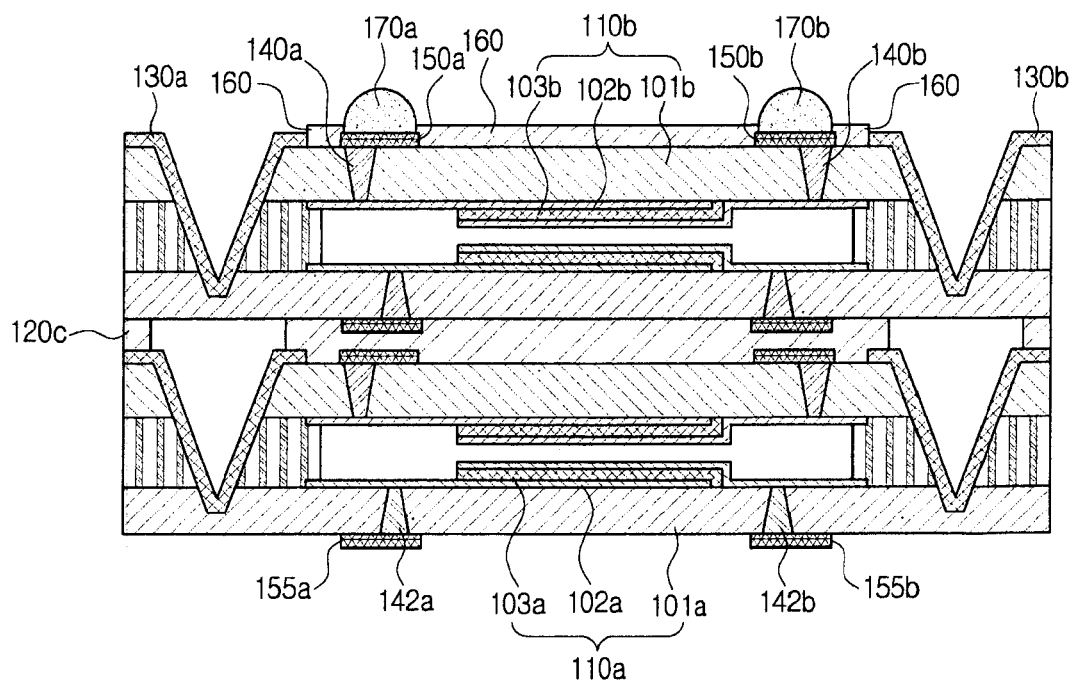
Figure 4M:
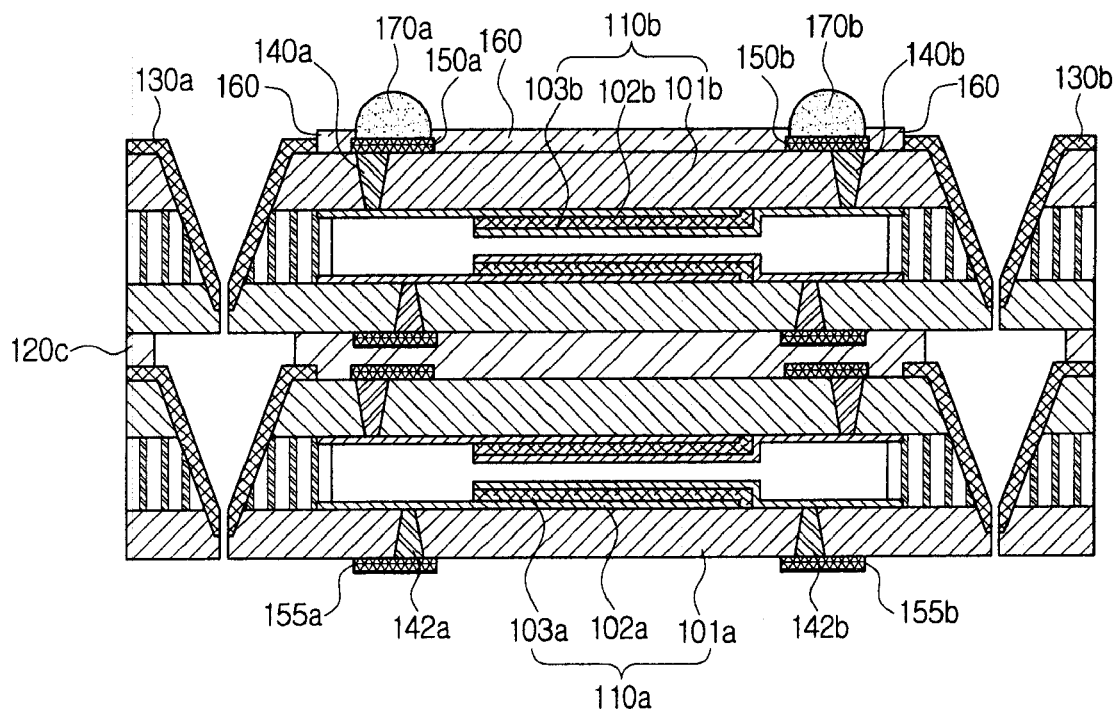
Figure 4N:
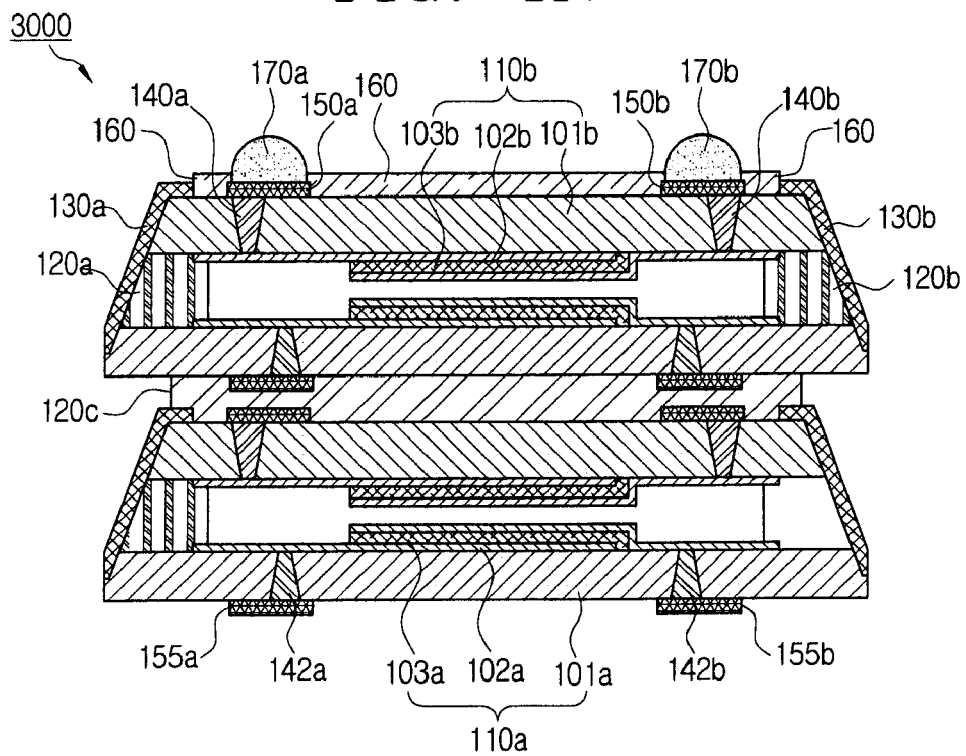

FIGS. 4A to 4N are cross-sectional views for showing manufacturing processes of a multi-stack micro package according to another exemplary embodiment of the present invention. Of the processes, description on FIGS. 4A to 4G will not be made since FIGS. 4A to 4G are the same as FIGS. 2A to 2G.

That is, if the solder mask 160 shown in FIG. 4G is completely formed, predetermined areas of the first substrate 101*a* are etched away in order for connection vias to be formed as shown in FIG. 4H. In here, the predetermined areas of the first substrate 101*a* etched away reaches below the bottom of the first pad 102*a* located between each of the bonding substance 120*a* and 120*b* and the first device 103*a*.

Next, as shown in FIG. 4I, first and second connection vias 142*a* and 142*b* are formed in the predetermined areas etched away, so the first pad 102*a* formed over the first substrate 101*a* is electrically connected to the first and second connection vias 142*a* and 142*b*. In here, the first and second connection vias 142*a* and 142*b* formed on the first substrate 101*a* has a shape of '∧.'

Next, the connection pads 155*a* and 155*b* shown in FIG. 4J are formed below and around the first and second connection vias 142*a* and 142*b*. Next, as shown in FIG. 4k, a bonding process is carried out for vertically bonding plural packages by bonding substance 120*c*.

Hereinafter, a package stacked uppermost is referred to as a first package and a package just below the first package is referred to as a second package. FIGS. 4K to 4N show that two packages are vertically bonded. However, without being limited to FIGS. 4K to 4N, more than two packages can be vertically bonded.

If the bonding process of the first and second packages is finished, the first and second solder bumpers 170*a* and 170*b* are formed over the first and second UBMs 150*a* and 150*b*. Next, a process is carried out for sawing away the bottom end portions of the first and second metal layers 130*a* and 130*b* formed in the first and second packages vertically stacked as shown in FIG. 4M.

Thus, FIG. 4N is a cross-sectional view for showing a final multi-stack micro package manufactured according to an exemplary embodiment of the present invention. In FIG. 4N, the multi-stack micro package 3000 according to an exemplary embodiment of the present invention is structured with the micro packages 1000 of FIG. 2J vertically stacked by the bonding substance 120*c*, the first and second connection pads 155*a* and 155*b*, the first and second connection vias 142*a* and 142*b*, and not limited to the micro packages 1000, but can be structured with the micro packages 2000 of FIG. 3 vertically stacked.

As stated above, the exemplary embodiments of the present invention have aspects of guaranteeing the hermetical sealing since the metal layers formed on side walls of a package prevent moisture absorption from outside at the same time of lowering possibility of damages to the devices inside the package since the processing temperature drops below 150° upon wafer bonding due to the use of the polymer substance as a bonding substance.

As aforementioned, the foregoing exemplary embodiments and their aspects are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A micro package manufacturing method comprising:
   (a) bonding at least one device substrate and at least one protection cap by patterning at least one bonding substance on a first predetermined area of the device substrate;
   (b) etching away a second predetermined area comprising a portion of the device substrate, a portion of the bonding substance and a portion of the protection cap in a first predetermined shape to form at least one layer;
   (c) etching away a third predetermined area comprising another portion of the protection cap in a second predetermined shape to form at least one via, whereby the via is electrically connected to an upper surface of the device substrate through the bonding substance;
   (d) depositing the layer and the via on the etched second predetermined area and in the etched third predetermined area, respectively;
   (e) forming at least one under-barrier metal (UBM) on the via;
   (f) forming at least one solder mask on a fourth predetermined area on an upper surface of the protection cap;

(g) forming at least one solder bumper, being a connection terminal for an external signal, on the UBM; and (h) cutting the layer and separating out the micro package.

2. The micro package manufacturing method as claimed in claim 1, wherein the device substrate, comprising a semiconductor wafer, comprises:
at least one device, comprising at least one circuit module, mounted on the device substrate; and
at least one pad which provides electrical connection to the device.

3. The micro package manufacturing method as claimed in claim 2, wherein the external signal flows to the device through the solder bumper, the UBM, the via, the bonding substance and the pad, wherein the solder bumper is insulated from a metal part other than the UBM by the solder mask.

4. The micro package manufacturing method as claimed in claim 1, wherein the protection cap comprises at least one of silicon, high-resistivity silicon and glass.

5. The micro package manufacturing method as claimed in claim 2, wherein the protection cap comprises:
another at least one device, comprising at least one circuit module, mounted on a lower surface of the protection cap; and
another at least one pad which provides electrical connection to the other device.

6. The micro package manufacturing method as claimed in claim 5, wherein the external signal flows to:
the device through the solder bumper, the UBM, the via, the other pad, the bonding substance and the pad; and
the other device through the solder bumper, the UBM, the via and the other pad, wherein the solder bumper is insulated from a metal part other than the UBM by the solder mask.

7. The micro package manufacturing method as claimed in claim 1, wherein the bonding substance comprises an anisotropic conductive film.

8. The micro package manufacturing method as claimed in claim 1, wherein the layer protects the device and prevents moisture absorption from outside.

9. The micro package manufacturing method as claimed in claim 1, wherein the layer comprises at least one of Au, Sn, In, Pb, Ag, Bi, Zn, Cu and an alloy of the above listed.

10. The micro package manufacturing method as claimed in claim 1, wherein the layer and the via are deposited by at least one of electrolytic and electroless plating, sputtering process and electronic beams.

11. The micro package manufacturing method as claimed in claim 1, wherein the first predetermined shape comprises a shape of 'V.'

12. A micro package manufacturing method comprising:
(a) bonding at least one device substrate and at least one protection cap by patterning at least one bonding substance on a first predetermined area of the device substrate;
(b) etching away a second predetermined area comprising a portion of the device substrate, a portion of the bonding substance and a portion of the protection cap in a first predetermined shape to form at least one layer;
(c) etching away a third predetermined area comprising another portion of the protection cap and another portion of the bonding substance in a second predetermined shape to form at least one via, whereby the via is in a direct electrical connection with an upper surface of the device substrate;
(d) depositing the layer and the via on the etched second predetermined area and in the etched third predetermined area, respectively;
(e) forming at least one under-barrier metal (UBM) on the via;
(f) forming at least one solder mask on a fourth predetermined area on an upper surface of the protection cap;
(g) forming at least one solder bumper, being a connection terminal for an external signal, on the UBM; and
(h) cutting the layer and separating out the micro package.

13. A multi-stack micro package manufacturing method, comprising:
(a) bonding at least one device substrate and at least one protection cap by patterning at least one bonding substance on a first predetermined area of the device substrate;
(b) etching away a second predetermined area comprising a portion of the device substrate, a portion of the bonding substance and a portion of the protection cap in a first predetermined shape to form at least one layer;
(c) etching away a third predetermined area comprising another portion of the protection cap in a second predetermined shape to form at least one via, whereby the via is electrically connected to an upper surface of the device substrate through the bonding substance;
(d) depositing the layer and the via on the etched second predetermined area and in the etched third predetermined area, respectively;
(e) forming at least one under-barrier metal (UBM) on the via;
(f) etching away a fourth predetermined area of the device substrate in a third predetermined shape for formation of at least one connection via and depositing the connection via in the etched fourth predetermined area;
(g) forming at least one connection pad on the connection via;
(h) stacking vertically two or more of a package manufactured in (a) through (g) by another at least one bonding substance;
(i) forming at least one solder mask on a fifth predetermined area of an upper surface of the protection cap of an uppermost stacked package of the two or more of the package; and
(j) forming at least one solder bumper, being a connection terminal for an external signal, on the UBM of the uppermost stacked package.

14. The multi-stack micro pages manufacturing method as claimed in claim 13, wherein the third predetermined shape comprises a shape of '∧.'

15. A multi-stack micro package manufacturing method, comprising:
(a) bonding at least one device substrate and at least one protection cap by patterning at least one bonding substance on a first predetermined area of the device substrate;
(b) etching away a second predetermined area comprising of a portion of the device substrate, a portion of the bonding substance and a portion of the protection cap in a first predetermined shape to form at least one layer;
(c) etching away a third predetermined area comprising another portion of the protection cap and another portion of the bonding substance in a second predetermined shape to form at least one via, whereby the via is in a direct electrical connection with an upper surface of the device substrate;

(d) depositing the layer and the via on the etched second predetermined area and in the etched third predetermined area, respectively;

(e) forming at least one under-barrier metal (UBM) on the via;

(f) etching away a fourth predetermined area of the device substrate in a third predetermined shape for formation of at least one connection via and depositing the connection via in the etched fourth predetermined area;

(g) forming at least one connection pad on the connection via;

(h) stacking vertically two or more of a package manufactured in (a) through (g) by another at least one bonding substance;

(i) forming at least one solder mask on a fifth predetermined area on an upper surface of the protection cap of an uppermost stacked package of the two or more of the package; and (j) forming at least one solder bumper, being a connection terminal for an external signal, on the UBM of the uppermost stacked package.

* * * * *